(12) United States Patent
Suzuki (10) Patent No.: US 6,668,067 B2
(45) Date of Patent: Dec. 23, 2003

(54) ELECTROACOUSTIC TRANSDUCER

(75) Inventor: Kazushi Suzuki, Shizuoka (JP)

(73) Assignee: Star Micronics Co., Ltd., Shizuoka (JP)

(*) Notice: Subject to any disclaimer, the term of this patent is extended or adjusted under 35 U.S.C. 154(b) by 43 days.

(21) Appl. No.: 09/785,166

(22) Filed: Feb. 20, 2001

(65) Prior Publication Data

US 2001/0017923 A1 Aug. 30, 2001

(30) Foreign Application Priority Data

Feb. 29, 2000 (JP) .................................. P. 2000-054025

(51) Int. Cl.[7] .................................................. H04R 1/00
(52) U.S. Cl. ........................ 381/410; 381/396; 381/409
(58) Field of Search ................................ 381/150, 152, 381/412, 396, 427, 417, 418, 409, 410, 411, 431

(56) References Cited

U.S. PATENT DOCUMENTS

| | | | | |
|---|---|---|---|---|
| 4,507,800 A | * | 3/1985 | Kelly | 381/150 |
| 5,581,623 A | * | 12/1996 | Ishimura et al. | 381/310 |
| 5,625,700 A | * | 4/1997 | Sone | 381/150 |
| 5,923,769 A | * | 7/1999 | Fushmi | 381/150 |
| 6,023,518 A | | 2/2000 | Kuwabara et al. | |

FOREIGN PATENT DOCUMENTS

EP 0 755 165 B1 1/1997

* cited by examiner

Primary Examiner—Rexford Barnie
(74) Attorney, Agent, or Firm—Sughrue Mion, PLLC (57) ABSTRACT

An electroacoustic transducer (1) includes a diaphragm (20) made of magnetic material and spaced from the forward end of the magnetic core; a magnet (25); a coil (23) wound around the magnetic core (22) and supplying an oscillating magnetic field to the diaphragm; a support ring (26) which supports the diaphragm (20); a lower housing (30) which accommodates members; an upper housing (10) attached to the upper housing (10). Coil spring-like terminals (52) are attached to terminal accommodating portions (5 Ga) which are opened in the bottom face of the lower housing (30). Lead wires (23a) and (23b) of the coil (23) are directly connected to the terminals (52), respectively. The terminal accommodating portions (50a) are sealed by a soldering process.

5 Claims, 6 Drawing Sheets

ELECTROACOUSTIC TRANSDUCER

BACKGROUND OF THE INVENTION

1. Field of the Invention

The present invention relates to an electroacoustic transducer which generates a sound due to electromagnetic acoustic conversion.

2. Description of the Related Art

An electroacoustic transducer has a magnetic circuit in which a magnetic field developed by a magnet passes through a base member, a magnetic core and a diaphragm and then returns to the magnet. When an oscillating electric signal is supplied to a coil wound around the magnetic core, an oscillating magnetic field is generated by the coil and then superimposed on the static magnetic field of the magnetic circuit, and vibration of the diaphragm is transmitted to the air, thereby generating a sound.

Such an electroacoustic transducer is often provided with terminals for supplying a power to the coil and connected to a wiring pattern on a circuit board by soldering in the same manner as other electronic components.

Recently, a method of performing electrical connection by using only mechanical pressing connection between a spring terminal and a circuit board is becoming widespread. According to this method, a soldering process is not necessary, thereby leading to advantages such that the heat resistance of components can be relaxed, and that steps of soldering and preprocessing for the soldering can be reduced.

As a related art, JP-A-8-321670 and JP-A-11-313394 disclose an electromagnetic sound generator having plate spring-like terminals. In a configuration in which terminals are disposed on the bottom face of the body, the height in a mounted state is increased.

JP-A-11-313393 discloses an electromagnetic sound generator having coil spring-like terminals. Lead wires of a coil are electrically connected to the terminals through a lead frame. Therefore, a soldering process must be conducted on at least four places. This may increase the number of assembly steps, and the defective ratio of the connecting portions.

SUMMARY OF THE INVENTION

The invention has been made to solve the above problems, and therefore an object of the invention is provide an electroacoustic transducer which is capable of reducing the height and size of the transducer in a mounted state and improving the reliability of mounting by means of springs.

To achieve the above object, according to the invention, there is provided an electroacoustic transducer comprising:

a diaphragm made of magnetic material;

an electromagnetic coil for supplying an oscillating magnetic field to said diaphragm;

a housing member for housing said diaphragm and said electromagnetic coil;

coil-like spring terminals which are in contact with an external circuit board for an electric connection; and terminal accommodating portions which are opened in a bottom face of said housing member for accommodating the spring terminals;

wherein lead wires of said electromagnetic coil are directly connected to said spring terminals; and wherein said terminal accommodating portion are sealed by a connecting process.

According to the invention, the direct connection of the lead wires of the electromagnetic coil with the spring terminals can reduce the number of connecting processes as compared with the conventional configuration in which a lead frame is interposed. Therefore, the number of assembly steps as well as the defective ratio of the connecting portions can be reduced.

In the present invention, since the terminal accommodating portions are sealed by a connecting process using solder, an electrically conductive adhesive agent or the like, the sealing property of the internal space of the component can be ensured. Therefore, foreign substances such as dust and moisture are prevented from entering the interior of the housing through the terminal accommodating portions, with the results that the life period and reliability of the component can be improved.

Also, according to the invention, the terminal accommodating portions are formed at the side of the diaphragm.

In the invention, since the terminal accommodating portions are formed at the side of the diaphragm, the component can be so thinned as to reduce the height of the electroacoustic transducer in a mounted state.

Further, according to the invention, terminal plates are interposed between the lead wires of the electromagnetic coil and the spring terminals, respectively.

In the invention, since the terminal plates are interposed between the lead wires of the electromagnetic coil and the spring terminals, a connecting process using solder, an electrically conductive adhesive agent or the like can be easily performed, and the support strength of the spring terminals in a state where the transducer is mounted on a circuit board can be enhanced.

DETAILED DESCRIPTION OF THE PREFERRED EMBODIMENTS

Now, a description will be given in more detail of preferred embodiments of the invention with reference to the accompanying drawings.

Figure 1:
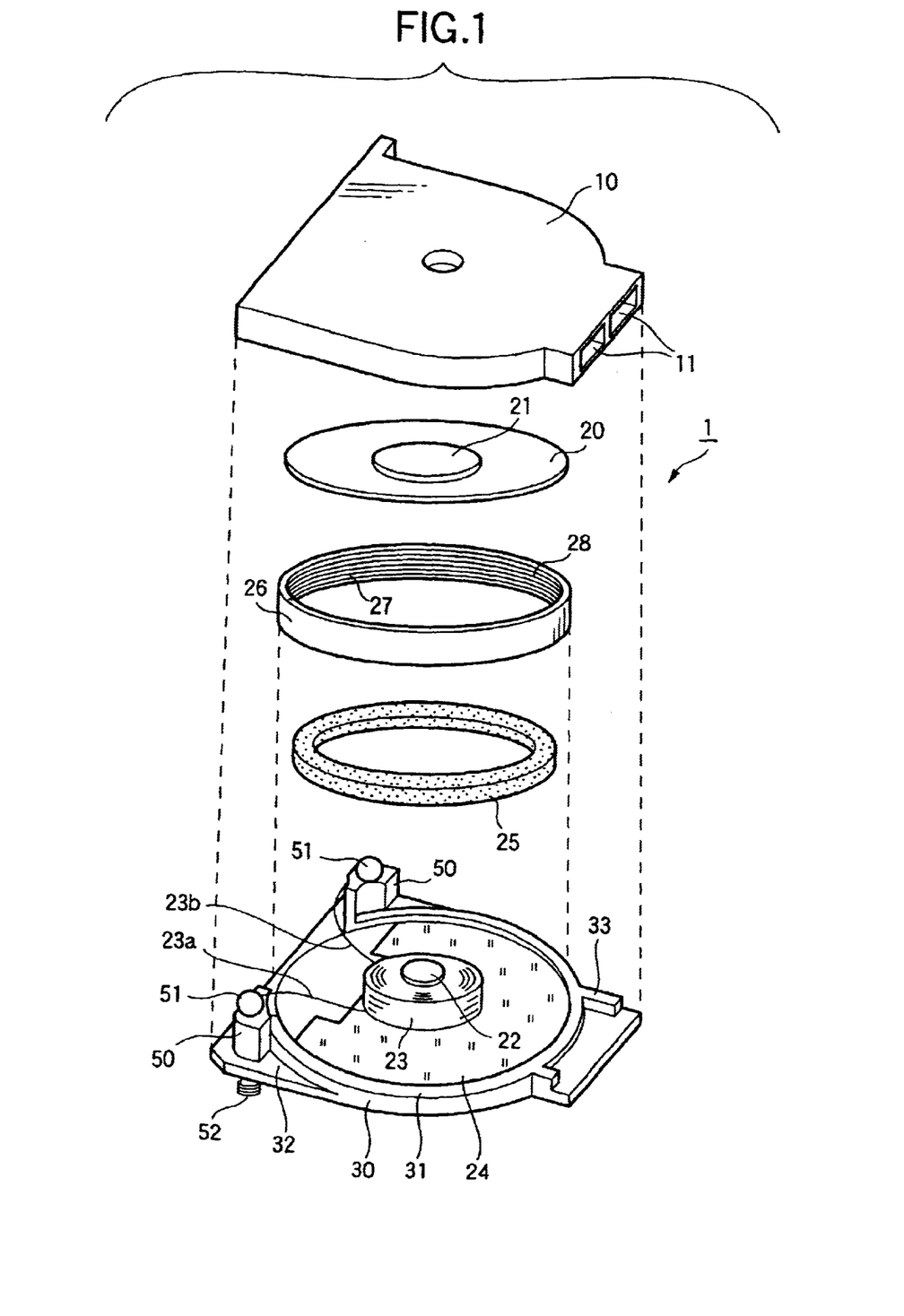
FIG. 1 is an exploded perspective view showing an embodiment of the invention.
Figure 2:
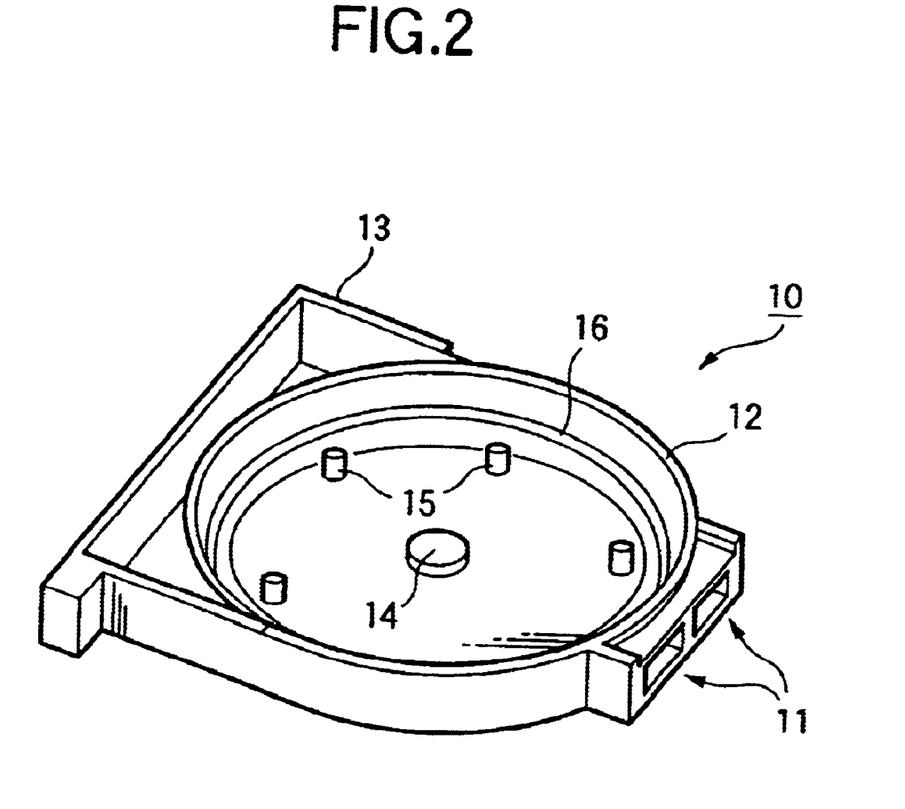
FIG. 2 is a perspective view as seeing an upper housing 10 from the rear side.

FIG. 1 is an exploded perspective view showing an embodiment of the invention, and FIG. 2 is a perspective view showing an upper housing 10 viewed from the rear side. An electroacoustic transducer 1 is structured by accommodating a base 24, a magnetic core 22, a coil 23, a magnet 25, a support ring 26, and a diaphragm 20 on a lower housing 30, and attaching the upper housing 10 to the lower housing. The transducer has a substantially D-like shape in a plan view as a whole, and approximate dimensions of, for example, a width of 11 mm×a length of 10 mm×a height of 3 mm, excluding projections.

The lower housing 30 is made of synthetic resin such as thermoplastic resin, and has an annular ridge 31 which elongates over about five sixths of the circumference. The plate-like base 24 having a substantially D-like shape which is obtained by partly cutting away a circular plate is attached onto the inner side of the ridge 31. The columnar magnetic core 22 is erected on the center of the base 24. The coil 23 is wound around the magnetic core 22. Alternatively, the magnetic core 22 and the base 24 may be made of magnetic material and integrated with each other by press fitting or the like so as to be configured as a single pole-piece member.

The magnet 25 has an annular shape which is slightly smaller than the inner diameter of the ridge 31, and is placed on the base 24 concentrically with the magnetic core 22. An annular inner space is ensured between the magnet 25 and the coil 23.

The support ring 26, which is made of non-magnetic material, has an outer diameter slightly smaller than the inner diameter of the ridge 31, and is placed on the base 24 with being in contact therewith. A plurality of annular steps are formed in the inner surface of the support ring 26 including a protruding portion 27 and a support step 28. The rear side of the protruding portion 27 abuts against the upper and outer faces of the magnet 25 to restrict the position of the magnet 25. The support step 28 is annually formed on the protruding portion 27. The disk-like diaphragm 20 is horizontally placed on the step 28 so as to be positioned in place.

The diaphragm 20 is made of magnetic material and supported at the peripheral edge portion by the step 28 of the support ring 26, so that a constant air gap is ensured between the center of the back face of the diaphragm 20 and the forward end of the magnetic core 22. A disk-like magnetic piece 21 is fixed to the center of the front face of the diaphragm 20 so as to increase the mass of the diaphragm 20, resulting in an improvement of the efficiency of vibrating the air.

The upper housing 10 is made of synthetic resin such as thermoplastic resin, and has an annular ridge 12 and a box-like ridge 13 as shown in FIG. 2. A constant air space is formed inside the ridges 12 and 13, and a box-like sound release hole 11 is defined in a circumferential portion which is opposite to the ridge 13. An annular step 16 is formed on the inner face of the ridge 12. The wall diameter of the step 16 is slightly smaller than the outer diameter of the support ring 26 or has a dimension which enables the whole circumference of the step to be lightly press-fitted to the support ring 26. The horizontal face of the step 16 abuts against the upper face of the support ring 26 to restrict the position of the support ring 26.

A plurality of projections 14 and 15 are formed on the ceiling surface of the upper housing 10 in the following manner. In a state where the upper housing 10 is attached, the center projection 14 is spaced from the magnetic piece 21 of the diaphragm 20 at a given interval, and the six projections 15 are spaced from the diaphragm 20 at a given interval. The projections 14 and 15 serves as shock absorbers that prevent the diaphragm 20 from slipping off or being deformed when a strong shock is applied to the body of the transducer, and are formed so as to have a height at which the projections do not disturb normal vibration of the diaphragm 20.

When the upper housing 10 is attached to the lower housing 30, the ridge 12 of the upper housing 10 is slightly engaged with the ridge 31 of the lower housing 30, and the end faces of the ridges 12 and 31 serve as joining faces. The ridge 13 of the upper housing 10 abuts against an edge of a rectangular portion 32 of the lower housing 30, and their abutting faces serve as joining faces. The rear face of the sound release hole 11 of the upper housing 10 abuts against short ridges 33 of the lower housing 30, and their abutting faces serve as joining faces.

Two terminal blocks 50 each accommodating a coil spring-like terminal 52 are formed at corners of the rectangular portion 32, respectively. Since the terminal blocks 50 are formed at the side of the diaphragm 20, the component can be thinned, and the height of the electroacoustic transducer in a mounted state can be reduced.

Figure 3A:
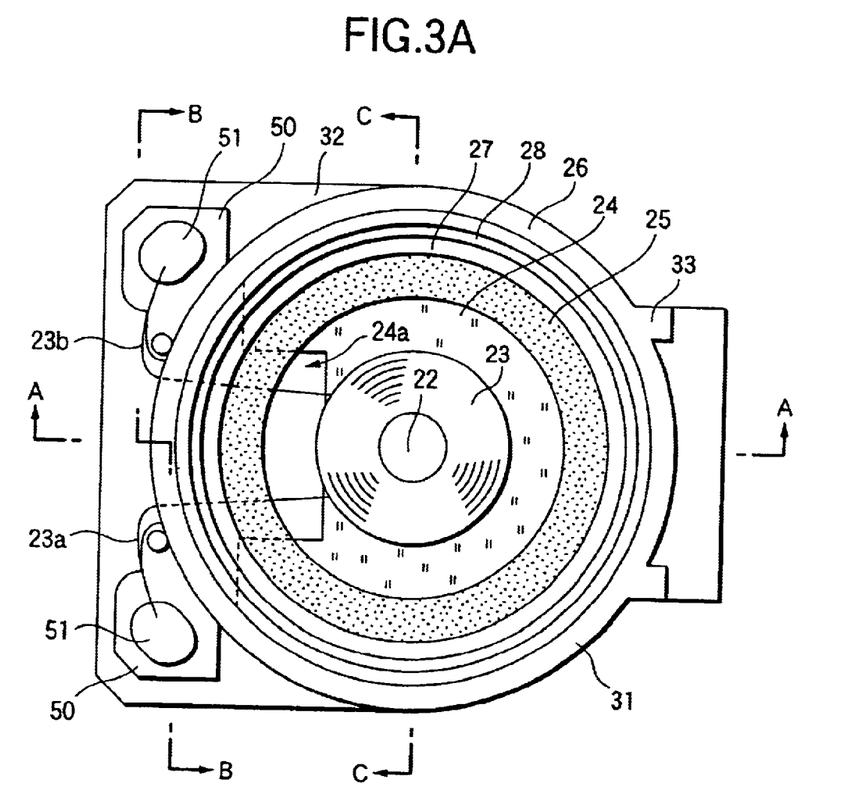
FIG. 3A is a plan view showing a state where the upper housing 10 is removed away, as seeing from the upper side.
Figure 3B:
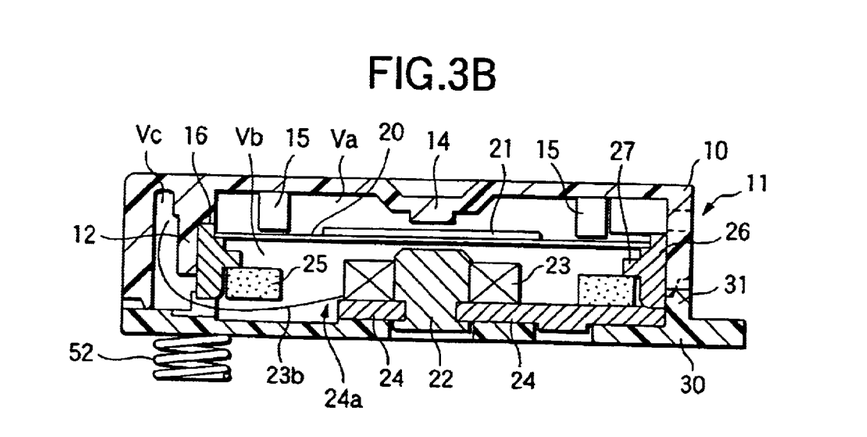
FIG. 3B is an end view showing a state where the upper housing 10 of FIG. 3A is joined, and taken along the line A—A.
Figure 4:
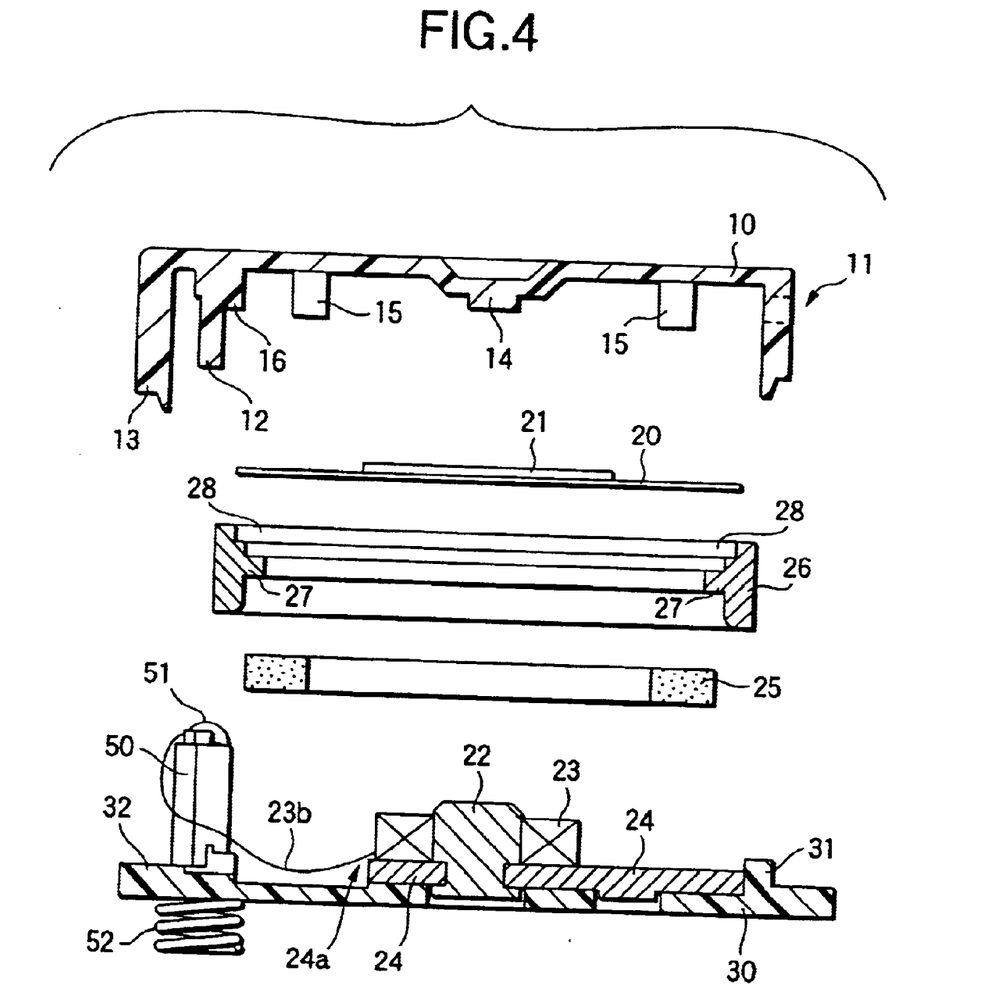
FIG. 4 is an exploded end view of FIG. 3B.
Figure 5A:
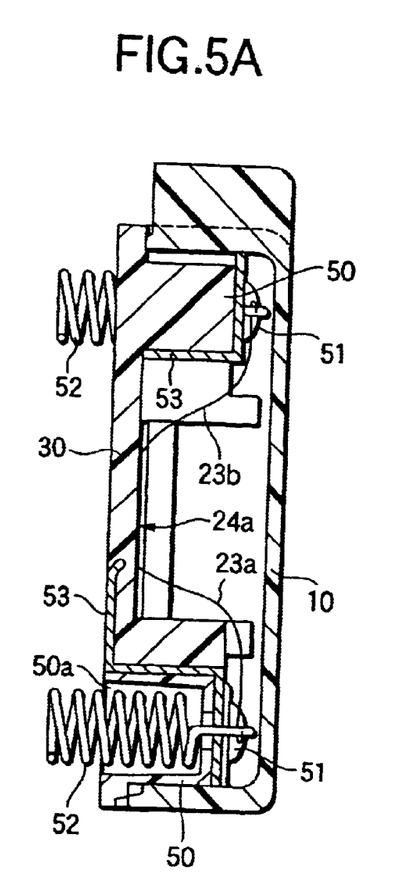
FIG. 5A is an end view showing a state where the upper housing 10 of FIG. 3A is joined, and taken along the line B—B.
Figure 5B:
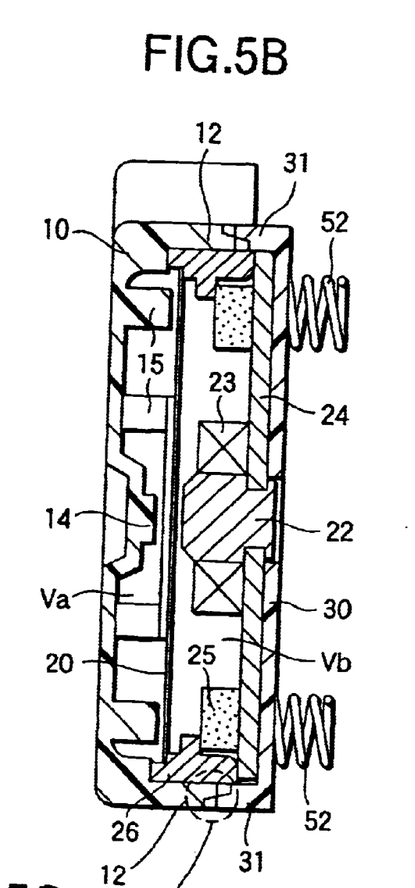
FIG. 5B is an end view showing a state where the upper housing 10 of FIG. 3A is joined, and taken along the line C—C.
Figure 5C:
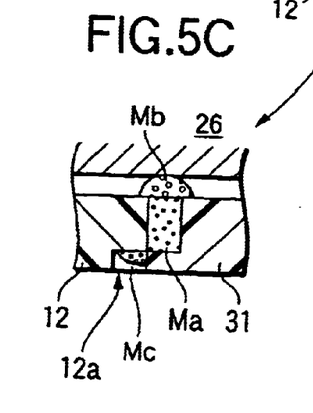
FIG. 5C is a partial enlarged view of joining portions of the housings.

FIG. 3A is a plan view showing a state where the upper housing 10 is removed away from the electroacoustic transducer, as seeing from the upper side, and FIG. 3B is an end view showing a state where the upper housing 10 of FIG. 3A is joined to the electroacoustic transducer, and taken along the line A—A. FIG. 4 is an exploded end view of FIG. 3B. FIG. 5A is an end view showing a state where the upper housing 10 of FIG. 3A is joined to the electroacoustic transducer, and taken along the line B—B, FIG. 5B is an end view showing a state where the upper housing 10 of FIG. 3A is joined to the electroacoustic transducer, and taken along the line C—C, and FIG. 5C is a partial enlarged view of joining portions of the housings.

First, referring to FIGS. 3 and 4, the coil 23 is wound around the center magnetic core 22, and the annular magnet 25 is coaxially placed with forming a constant gap. A part of the base 24 can be seen through the gap between the coil 23 and the magnet 25. The base 24 has a substantially D-like shape in a plan view. In the base 24, a communication portion 24a is formed by cutting away a portion on the side of the terminal blocks 50.

The communication portion 24a forms a gap corresponding to the thickness of the base 24 between the lower housing 30 and the magnet 25, to function as a path through which lead wires 23a and 23b of the coil 23 are drawn out to the terminal blocks 50, and also as a path through which a side space Vc around the terminal blocks 50 is communicated with the back space Vb of the diaphragm 20. The air tightness of the back space Vb and the side space Vc is maintained by welding the housings together, or the like, so that the rear sound of the diaphragm 20 hardly leaks to the outside. The formation of the communication portion 24a increases the acoustic capacity of the back space Vb of the diaphragm 20, and hence the air damping effect of the back space Vb can be reduced.

The support ring 26 is directly placed on the base 24, and the protruding portion 27 restricts the upper face periphery of the magnet 25. The step 28 of the support ring 26 supports the periphery of the diaphragm 20. This shape of the support ring 26 enables the magnet 25 and the diaphragm 20 to be positioned, and the efficiency of the magnetic coupling of the range of from the base 24 to the diaphragm 20 to be improved.

The diaphragm 20 is spaced from the forward end of the magnetic core 22 and the projections 14 and 15 of the upper housing 10 at given intervals, respectively, in such a manner that vertical vibrations are enabled and excess displacement which causes slipping off and deformation is suppressed.

The step 16 of the upper housing 10 abuts against the upper face of the support ring 26 to restrict the position of the support ring 26. The outer wall of the step 16 is lightly press-fitted to the support ring 26 over the whole periphery. This joining structure can prevent air leakage and sound leakage between the front space Va and the back space Vb of the diaphragm 20 from occurring without using an adhesive agent. Therefore, interference between the sound on the side of the front face and that on the side of the back face can be surely prevented from occurring.

Next, referring to FIG. 5A, each of the terminal blocks 50 has a terminal accommodating portion 50a which is opened in the bottom face of the lower housing 30. The coil spring-like terminals 52 are attached onto the terminal accommodating portions 50a, respectively. Terminal plates 53 are partially embedded into the terminal blocks 50 by insert molding, respectively. A through hole is formed in the ceiling of each of the terminal accommodating portions 50a, and the corresponding terminal plate 53. The forward ends of the terminals 52 pass through the respective through holes so as to protrude into the interior of the housing. In order to enhance the mass productivity, preferably, the terminal plates 53 are made of hoop material excellent in bendability.

The lead wires 23a and 23b of the coil 23 are drawn out toward the terminal blocks 50 through the communication portion 24a of the base 24, and then wound around the forward end portions of the terminals 52, respectively. The through holes of the terminal accommodating portion 50a are sealed by a connecting process using solder, an electrically conductive adhesive agent, or the like 51.

Since the lead wires 23a and 23b are directly connected to the terminals 52 as described above, the number of connecting processes can be reduced, so that the number of assembly steps and the proportion of defective connecting portions can be reduced. The sealing of the through holes of the terminal accommodating portions 50a ensures the sealing property of the internal space of the component. Therefore, foreign substances such as dust and moisture are prevented from entering the inner space of the component through the terminal accommodating portions 50a, resulting in an improvement in the life period and reliability of the component. Since the terminal plates 53 are interposed between the lead wires 23a and 23b and the terminals 52, a connecting process using solder, an electrically conductive adhesive agent or the like 51 can be easily performed, and the support strength of the terminals 52 in a state where the transducer is mounted on a circuit board can be enhanced by the strength of the terminal plates 53.

Next, referring to FIG. 5B, the upper housing 10 is attached onto the lower housing 30. Those housings 10 and 30 are set onto a working platform of an ultrasonic welder so as to be vertically pressed. Then, upon application of torsion vibrations about an axis to the housings 10 and 30, the joining faces of the ridges 12 and 31 are melt, and heat is thereafter radiated from the joining faces of the ridges 12 and 31 to harden the molten portions. As a result, the upper housing 10 and the lower housing 30 are welded to each other.

As shown in FIG. 5C, on the joining faces of the ridges 12 and 31, weld beads Mb and Mc rise in the inside and outside of the welded portion Ma where the housings are fuse-bonded to each other. The weld bead Mb comes in close contact with the outer peripheral face of the support ring 26 to seal the gap between the support ring 26 and the upper housing 10 or the lower housing 30. Because of this sealing structure, air leakage and sound leakage between the front space Va and the back space Vb of the diaphragm 20 can be prevented from occurring. Therefore, interference between the sound on the side of the front face and that on the side of the back face can be surely prevented from occurring.

A shallow groove 12a is formed in the whole circumference of the outside of the joining face of the ridge 12. Even when the weld bead Mc rises, the bead can settle in the groove 12a. Consequently, the weld bead Mc is prevented from swelling out.

Next, the operation will be described. The magnet 25 is magnetized in the thickness direction. When the bottom face of the magnet 25 is magnetized to the N-pole and the upper face to the S-pole, for example, lines of magnetic force emerging from the bottom face of the magnet 25 pass through a route of the peripheral edge portion of the base 24, a center portion of the base 24, the magnetic core 22, a center portion of the diaphragm 20, a peripheral edge portion of the diaphragm 20 and the upper face of the magnet 25 in the stated order, so as to configure a closed magnetic circuit as a whole. The magnet 25 has a function of supplying a static magnetic field to the magnetic circuit. The diaphragm 20 is stably supported in a state where the diaphragm is attracted toward the magnetic core 22 and the magnet 25 by the static magnetic field.

When an electric oscillating signal is supplied from the circuit board to the coil 23 wound around the magnetic core 22 via the terminals 52 and the lead wires 23a and 23b, the coil supplies an oscillating magnetic field to the magnetic circuit. Then, the oscillating magnetic field is superimposed on the static magnetic field to vibrate the diaphragm 20. As a result, the air on the side of the upper face of the diaphragm 20, and that on the side of the bottom face are vibrated.

The front space Va of the diaphragm 20 constitutes a resonance chamber. When the vibration frequency of the diaphragm 20 substantially coincides with the resonance frequency of the resonance chamber, a sound of a high sound pressure level is generated, and the sound is emitted to the outside through the sound release hole 11 of the upper housing 10.

Figure 6:
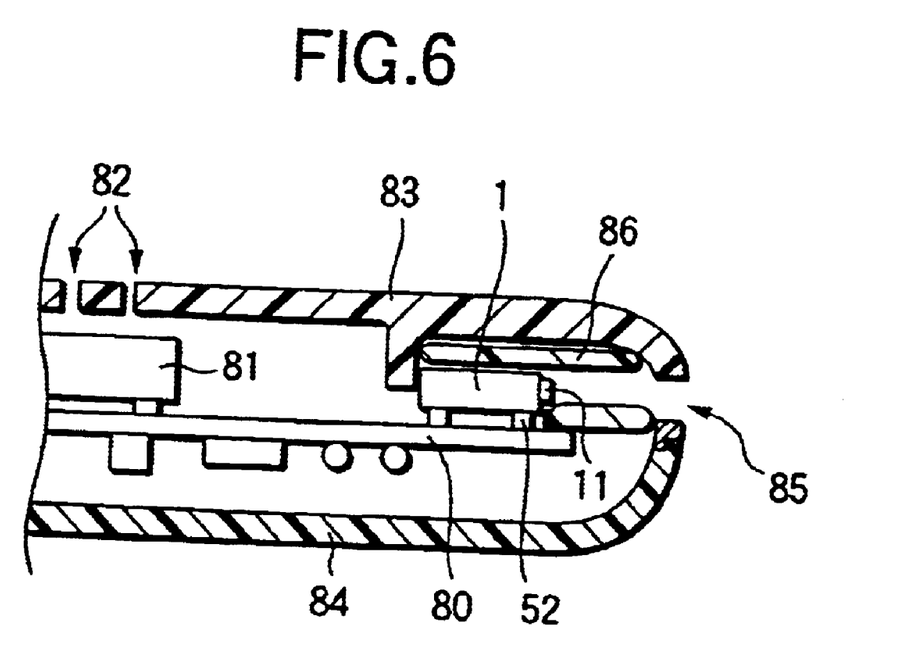
FIG. 6 is a partial section view showing a state where an electroacoustic transducer 1 is mounted in an electronic apparatus.

FIG. 6 is a partial section view showing a state where the electroacoustic transducer 1 is mounted in an electronic apparatus. In this example, the electronic apparatus is a portable telephone. Various electronic components are mounted on both the faces of a circuit board 80, and the board is accommodated in casings 83 and 84.

A hollow gasket 86 made of rubber material or the like is attached onto the electroacoustic transducer 1, and the whole of the gasket is pressingly held by the casing 83 and the circuit board 80. At this time, the coil spring-like terminal 52 is elastically contacted with the circuit board 80, thereby enabling an electrical connection to be attained. Therefore, solder-free assembly is realized. The gasket 86 has a function of communicating the sound release hole 11 with an external opening 85, and the hollow portion of the gasket 86 serves as a resonance chamber for the diaphragm 20.

The electroacoustic transducer 1 of the invention is configured as a closed type one in which the rear sound of the diaphragm 20 is not released to the outside. Accordingly, even when a loudspeaker 81 is disposed in the vicinity of the electroacoustic transducer 1, a phenomenon in which the rear sound leaks into an opening 82 of the loudspeaker to disturb communication does not occur. This makes it possible to realize high-density mounting of electronic components.

Since the electroacoustic transducer 1 is configured as a closed type one in which a rear sound release hole is not disposed, there is no possibility that foreign substances enter such a release hole. This is effective in improvement of the reliability of the component.

In the above-described embodiment, the lower housing 30 to which the upper housing 10 is to be attached functions as a member for supporting the diaphragm, and the support ring 26 which supports the diaphragm 20 is placed in the lower housing 30. Alternatively, the magnet 25 may function also as a member for supporting the diaphragm, or a portion for supporting the diaphragm 20 may be formed integrally with the lower housing 30.

In the above-described embodiment, the communication portion 24a for communicating the side space Vc with the back space Vb is formed by cutting away the base 24. Alternatively, such a communication portion which leads to the side space Vc may be configured by forming a cutaway or a through hole in the magnet 25, the support ring 26, the lower housing 30, etc.

As was described above in detail, according to the invention, the direct connection of the lead wires of the electromagnetic coil with the spring terminals can reduce the number of connecting processes, so that the number of assembly steps, and the proportion of defective connecting portions can be reduced.

Also, since the accommodation spaces of the terminal accommodating portions are sealed by a connecting process using solder, an electrically conductive adhesive agent or the like, the sealing property of the internal space of the component can be ensured. Therefore, the life period and reliability of the component can be improved.

Further, since the portions for accommodating the spring terminals are formed at the side of the diaphragm, the component can be thinned so that the height of the electroacoustic transducer in a mounted state can be reduced.

Still further, since the terminal plates for the connecting process are interposed between the lead wires of the electromagnetic coil and the spring terminals, a connecting process using solder, an electrically conductive adhesive agent, or the like can be easily performed, and the support strength of the spring terminals in a state where the transducer is mounted on a circuit board can be enhanced.

What is claimed is:

1. An electroacoustic transducer, comprising:

a diaphragm made of magnetic material;

an electromagnetic coil for supplying an oscillating magnetic field to said diaphragm;

a housing member formed of an upper housing and a lower housing, for housing said diaphragm and said electromagnetic coil;

coil shaped spring terminals which are in contact with an external circuit board to attain an electric connection;

terminal blocks for accommodating said spring terminals; and terminal accommodating portions, provided in said terminal blocks, which are opened in a bottom face of said housing member for accommodating said spring terminals, respectively;

wherein lead wires of said electromagnetic coil are directly connected to said spring terminals, wherein said terminal accommodating portions are sealed by a connecting process, wherein a space is formed around the terminal blocks which communicates with a back space formed in back of said diaphragm and around said electromagnetic coil so that said lead wires are connected to said spring terminals in the space that communicates with the back space, said upper and lower housings are welded together, to form the housing member, so as to maintain an air tightness of the back space, and wherein an inner face of the housing member is sealed by weld beats formed by the welding of said upper and lower housings.

2. An electroacoustic transducer according to claim 1, wherein said connecting process comprises a soldering process.

3. An electroacoustic transducer according to claim 1, wherein said terminal accommodating portions are formed at the side of said diaphragm.

4. An electroacoustic transducer according to claim 1, further comprising terminal plates interposed between said lead wires of said electromagnetic coil and said spring terminals, respectively.

5. An electroacoustic transducer according to claim 1, wherein the housing is lightly press-fitted to a support ring.

* * * * *